US012753067B2

(12) United States Patent
Azpeitia Urquia et al.

(10) Patent No.: US 12,753,067 B2
(45) Date of Patent: Oct. 6, 2026

(54) MEMS STRUCTURE INCLUDING A BURIED CAVITY WITH ANTISTICTION PROTUBERANCES, AND MANUFACTURING METHODS THEREOF

(71) Applicant: STMicroelectronics S.r.l., Agrate Brianza (IT)

(72) Inventors: Mikel Azpeitia Urquia, Milan (IT); Enri Duqi, Milan (IT); Silvia Nicoli, Briosco (IT); Roberto Campedelli, Novate Milanese (IT); Igor Varisco, Settimo Milanese (IT); Lorenzo Tentori, Verano Brianza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 605 days.

(21) Appl. No.: 18/302,610

(22) Filed: Apr. 18, 2023

(65) Prior Publication Data

US 2023/0348258 A1 Nov. 2, 2023

(30) Foreign Application Priority Data

May 2, 2022 (IT) ........................ 102022000008822

(51) Int. Cl.
*B81B 3/00* (2006.01)
*B81C 1/00* (2006.01)

(52) U.S. Cl.
CPC .......... *B81B 3/001* (2013.01); *B81C 1/00158* (2013.01); *B81B 2201/0264* (2013.01); *B81B 2203/0127* (2013.01); *B81B 2203/0315* (2013.01); *B81B 2203/033* (2013.01); *B81B 2203/0361* (2013.01); *B81B 2207/11* (2013.01);

(Continued)

(58) Field of Classification Search
CPC ............ B81B 3/001; B81B 2201/0264; B81B 2203/0127; B81B 2203/0315; B81B 2203/033; B81B 2203/0361; B81B 2207/11; B81C 1/00158; B81C 2201/014; B81C 2201/0156; B81C 2201/0169; B81C 2201/0177
See application file for complete search history.

(56) References Cited

U.S. PATENT DOCUMENTS

2005/0181529 A1 8/2005 Benzel et al.
2009/0170312 A1 7/2009 Caplet
(Continued)

FOREIGN PATENT DOCUMENTS

CN 105282678 A 1/2016
CN 106257254 A 12/2016
(Continued)

OTHER PUBLICATIONS

Sato et al. "A new substrate engineering for the formation of empty space in silicon (ESS) induced by silicon surface migration," International Electron Devices Meeting 1999, Washington, DC, USA, 1999, pp. 517-520.

*Primary Examiner* — Samuel A Gebremariam
(74) *Attorney, Agent, or Firm* — Seed Intellectual Property Law Group LLP

(57) ABSTRACT

MEMS structure, comprising: a semiconductor body; a cavity buried in the semiconductor body; a membrane suspended on the cavity; and at least one antistiction bump completely contained in the cavity with the function of preventing the side of the membrane internal to the cavity from sticking to the opposite side, which delimits the cavity downwardly.

20 Claims, 12 Drawing Sheets

(52) U.S. Cl.
CPC .............................. *B81C 2201/014* (2013.01); *B81C 2201/0156* (2013.01); *B81C 2201/0169* (2013.01); *B81C 2201/0177* (2013.01)

(56) References Cited

U.S. PATENT DOCUMENTS

| | | | |
|---|---|---|---|
| 2017/0015546 | A1 | 1/2017 | Kautzsch et al. |
| 2021/0285983 | A1 | 9/2021 | Tanaka |

FOREIGN PATENT DOCUMENTS

| | | | |
|---|---|---|---|
| CN | 113460952 | A | 10/2021 |
| EP | 2075224 | A2 | 7/2009 |
| EP | 3845485 | A1 | 7/2021 |

MEMS STRUCTURE INCLUDING A BURIED CAVITY WITH ANTISTICTION PROTUBERANCES, AND MANUFACTURING METHODS THEREOF

BACKGROUND

Technical Field

The present disclosure relates to a micromechanical or microelectromechanical structure, to manufacturing methods thereof, and to a MEMS transducer; in particular, this structure includes a buried cavity having one or more antistiction bumps extending therein.

Description of the Related Art

As known, integrated pressure sensors may be provided with micromanufacturing techniques. These sensors typically comprise a thin membrane, or diaphragm, suspended above a cavity obtained in a semiconductor body. Piezoresistive elements connected to each other are formed within the membrane and connected in a Wheatstone bridge. When subject to a pressure, the membrane undergoes a deformation, causing a variation in the resistance of the piezoresistive elements, and therefore an imbalance of the Wheatstone bridge. Alternatively, capacitive sensors are available, wherein the membrane provides a first plate of a capacitor, while a second plate is provided by a fixed reference. In use, the deflection of the membrane generates a variation in the capacitance of the capacitor, which may be detected and associated with the pressure exerted on the membrane.

A significant defect, which occurs in particular conditions in micromechanical devices, is the irreversible stiction of the movable structures with a fixed element adjacent thereto, or to the substrate. It is apparent that this phenomenon may entail serious consequences, up to making the MEMS systems affected thereby inoperative, in an unpredictable way. In particular, in case of a membrane, the stiction of the membrane to the substrate on which the membrane is suspended makes it unusable.

The stiction phenomenon is typically generated by the surface forces that are exerted between the surfaces of two bodies coming into contact. Of course, the wider the contact zone, the greater the interaction force between the surfaces. In addition, further factors that are to be considered in assessing and preventing stiction are, inter alia, the roughness of the surfaces, their wear, the level of humidity and the temperature of the environment wherein the micromechanical structures operate. These parameters are particularly difficult to monitor in case of membranes suspended on buried cavities, due to the inherent difficulty of operating internally to these buried cavities to reduce the causes of stiction.

A possible solution lies in the stiffening of the membrane, so that it never reaches the full stroke during use and no direct contact occurs between the opposite surfaces delimiting the cavity having the membrane suspended thereon. For example, it is possible to increase the stiffness of the membrane by increasing the thickness of the membrane. In manufacturing processes of known semiconductor pressure sensors, the membrane is formed by an epitaxial growth. The increase in the epitaxial growth time, necessary to obtain a thicker membrane, has several drawbacks such as, for example, an increase in costs and an increase in the non-uniformity of the rear side of the semiconductor wafer, which cause difficulties in handling the wafer and incompatibility problems with subsequent steps of the manufacturing process. Furthermore, the known integrated semiconductor pressure sensors are typically designed and used to measure relatively low pressures (for example up to 0.1 MPa), and a stiffening of the membrane thereof might cause an operating difficulty at such pressures.

BRIEF SUMMARY

The present disclosure is directed to a micromechanical or microelectromechanical structure, manufacturing methods thereof, and a microelectromechanical transducer.

The disclosure is directed to a structure comprising a semiconductor body; a cavity buried in the semiconductor body, the cavity internally delimited by a first wall, a second wall opposite to the first wall, and third and fourth walls coupled between the first wall with the second wall; and a membrane extending including the first wall of the cavity, the membrane has a first and a second antistiction bump, completely contained in the cavity, the first antistiction bump protruding from one of the first wall and the second antistiction bump protruding from the second wall, the first and second antistiction bumps being centrally positioned in the cavity.

BRIEF DESCRIPTION OF THE SEVERAL VIEWS OF THE DRAWINGS

For a better understanding of the present disclosure, preferred embodiments thereof are now described, purely by way of non-limiting example.

DETAILED DESCRIPTION

Figure 1:
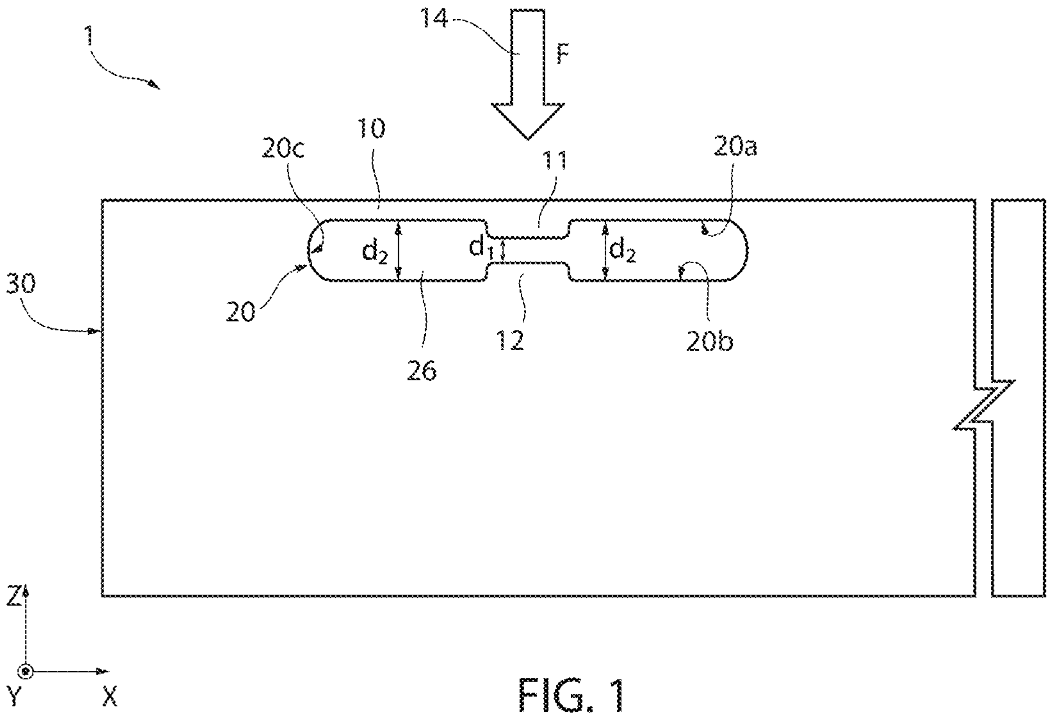
FIG. 1 illustrates, in lateral sectional view, a micromechanical structure according to an embodiment of the present disclosure.

FIG. 1 illustrates, in a triaxial system of X, Y, Z axes orthogonal to each other, a portion of a semiconductor wafer 1 including a micromechanical or microelectromechanical (MEMS) structure according to an embodiment of the present disclosure. However, it is apparent that what has been described applies similarly to a portion of a semiconductor wafer, for example to a die. Similarly, at the end of the processing steps of the wafer, this may be diced ("dicing" operation) to isolate a plurality of dies or chips.

The wafer 1, or die, comprises a semiconductor body 30 which accommodates a membrane suspended on a cavity 20 buried in the semiconductor body 30. The cavity 20 is delimited upwardly by a top side (or wall) 20*a* (which is part of the membrane 10) and downwardly by a bottom side (or wall) 20*b* (which is part of the semiconductor body 30), opposite to the top side 20*a* along the Z axis. Lateral sides (or walls) 20*c* physically connect the top side 20*a* with the bottom side 20*b*.

In one embodiment, the membrane 10 extends, at rest, substantially parallel to the XY plane. It is however possible to design the membrane 10 having internal stresses such that the membrane 10 extends, at rest, not perfectly parallel to the XY plane, but with a concave or convex shape. In the following of the present description and in the Figures it is assumed, for simplicity of description and representation, that the membrane 10 is parallel to the XY plane.

The cavity 20 has one or more protrusions, or protuberances, or "bumps," 11 which extend from the top side 20*a* towards the bottom side 20*b*, and vice versa, one or more protrusions, or protuberances, or "bumps," 12 which extend from the bottom side 20*b* towards the top side 20*a*. For sake of simplicity, FIG. 1 illustrates a single bump 11 and a single bump 12.

In a further embodiment, not illustrated, one of the bump 11 and the bump 12 may be omitted.

The membrane 10 is therefore partially suspended on the cavity 20 and is for bending when a suitable external force F is applied along the direction Z as identified by the arrow 14. At rest, when no external force Facts on the membrane 10, the membrane 10 is substantially parallel to the XY plane. In the presence of a suitable force F, the membrane 10 bends, and, as the force F increases, the membrane 10 bends up to a maximum bending wherein the bumps 11, 12 are in mutual contact.

The bumps 11, 12 operate, in this context, as antistiction structures, minimizing the risk of irreversible stiction between the opposite sides 20*a*, 20*b* internal to the cavity 20 when, during use, the sides 20*a*, 20*b* come close to each other. In fact, according to the present disclosure, the contact occurs exclusively between the bumps 11, 12 which have a reduced contact surface and, therefore, also the stiction forces are consequently reduced.

With reference to FIGS. 2A-2E, a manufacturing method of the membrane 10 on the buried cavity 20 in the semiconductor body 30 is described.

The wafer 1 is, in particular, of monocrystalline silicon; the wafer 1 may be N-type or P-type doped (the type of doping is not relevant for the present disclosure, and may be defined during the design step according to the specific application wherein the present technical solution is intended to operate).

As previously noted, reference will be made hereinafter to the processing of a wafer; however, what has been described applies similarly to the processing of portions of a semiconductor wafer, for example a die. Similarly, at the end of the processing steps of the wafer 1, this may be diced ("dicing" operation) to isolate a plurality of dies or chips manufactured simultaneously as described herein.

Figure 2A:
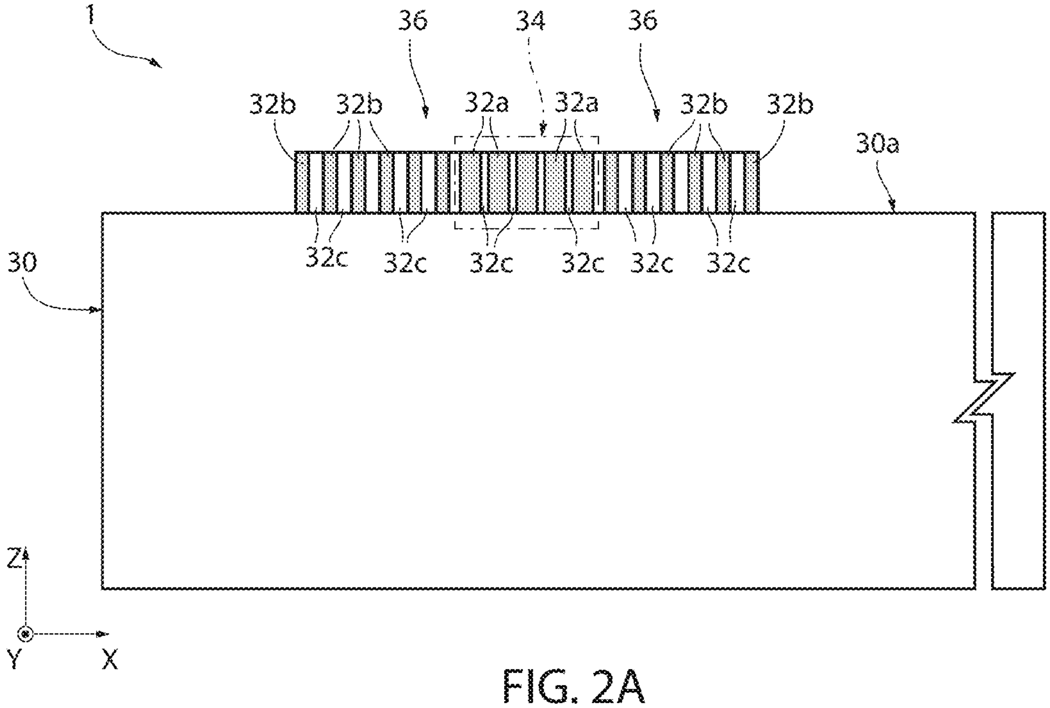
FIGS. 2A-2E illustrate steps of a manufacturing process of the micromechanical structure of FIG. 1.
Figure 2B:
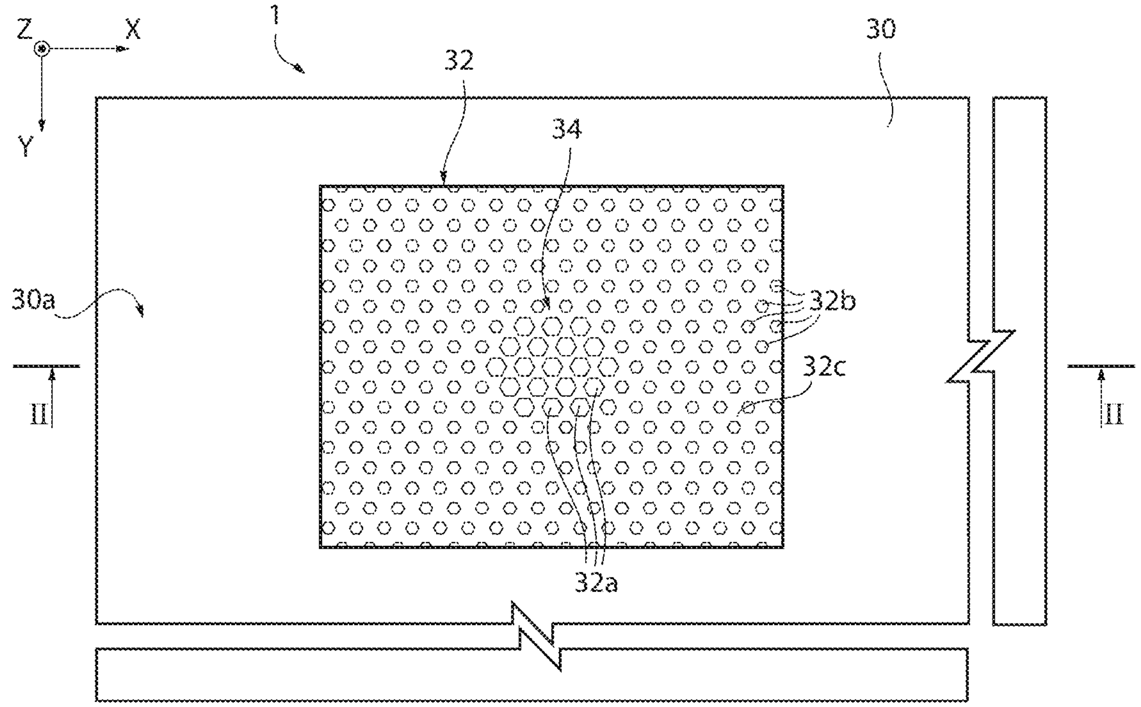

With joint reference to FIG. 2A (in lateral sectional view) and to FIG. 2B (in XY plane top view), the wafer 1 comprises the semiconductor body 30 (possibly previously processed, as needed, for example including a monocrystalline silicon epitaxial layer grown on a monocrystalline silicon substrate). The view of FIG. 2A is along section line II-II of FIG. 2B.

A photoresist mask 32 is provided above a top surface 30*a* of the semiconductor body 30 by a photolithography step. The mask 32 is formed at regions of the semiconductor body 30 wherein it is desired to form the buried cavity 20 and, consequently, the membrane 10 suspended thereon.

The mask 32 defines a honeycomb lattice, having first mask regions 32*a* and second mask regions 32*b*, for example of hexagonal shape in XY plane top view, close to each other and separated from each other by through openings 32*c* extending through the entire thickness of the mask 32.

In particular, the first and the second mask regions 32*a*, 32*b* are regions wherein the photoresist material is physically present ("full" regions); the through openings 32*c* are regions wherein the photoresist material has been removed ("empty" regions) by the photolithographic process, having the top surface 30*a* of the semiconductor body 30 exposed therethrough.

The first mask regions 32*a* have, in top view, a first value of base area; the second mask regions 32*b* have, in top view, a second value of base area, lower than the first value of base area.

In other words, according to an aspect of the present disclosure, the mask 32 has portions 34, 36 with full/empty ratio different from each other. The portion 34 comprises exclusively the first mask regions 32*a* and, in the portion 34, the full/empty ratio has a first value (e.g., of the order of 4). Therefore, inside the portion 34, all the first mask regions 32*a* have the same value of base area (unless there are variations depending on the tolerances of the same process).

Similarly, the portion 36 comprises exclusively the second mask regions 32*b* and, in the portion 36, the full/empty ratio has a second value (e.g., of the order of 2) which is lower than the first value. Within the portion 36, all the second mask regions 32*b* have the same value of base area (unless there are variations depending on the tolerances of the same process).

By way of example, in the portion 34, the first mask regions 32*a* have, as said, hexagonal shape in plan view and diameter (both along the X and Y axis) in the range 2.2-2.6 μm, and are separated from each other by a gap 32*c* having extension (both along the X and Y axis) in the range 0.4-0.8 μm. In the portion 36, the second mask regions 32*b* have a hexagonal shape and diameter (both along the X and Y axis) in the range 1.8-2.1 μm, and are separated from each other by a gap 32*c* having extension (both along the X and Y axis) in the range 0.9-1.2 μm.

Figure 2C:
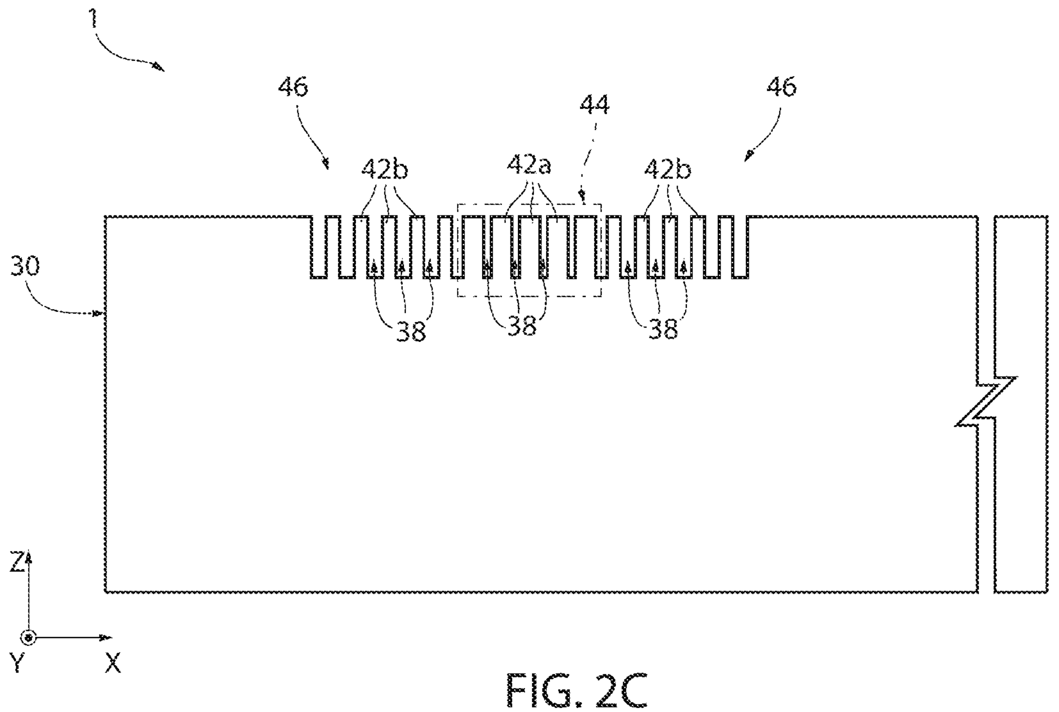

By using the mask 32, FIG. 2C, an etching of the semiconductor body 30 is performed, forming trenches 38 having depths, along the Z axis, of a few micrometers, for example depth comprised between 0.5 μm and 50 μm. The trenches 38 define columns 42*a*, 42*b* of silicon, having a shape corresponding to the shape of the honeycomb regions defined by the mask 32.

Therefore, portions 44, 46 corresponding to the portions 34, 36 of the mask 32 are defined also in the semiconductor body 30; the portion 44 comprises the silicon columns 42*a* which have shape, dimensions and mutual distance uniform to each other; similarly the portion 46 comprises the silicon columns 42*b* which have shape, dimensions and mutual distance uniform to each other and different with respect to the portion 44.

Each column 42*a* has, in the portion 44, shape and dimensions defined by the portion 34 of the mask 32, for example a hexagonal shape in XY plane plan view, and a diameter equal to about 2.4 μm, and is separated from an adjacent column, along X and along Y, by about 0.6 μm.

Each column 42*b* has, in the portion 46, shape and dimensions defined by the portion 36 of the mask 32, for example a hexagonal shape in XY plane plan view, and a diameter equal to about 2 μm, and is separated from an adjacent column, along X and along Y, by about 1 μm.

In other words, each column 42*a* has a base area (on the XY plane) which is different from the base area (on the XY plane) of each column 42*b*. The base area (on the XY plane) of the columns 42*a* is greater than the base area (on the XY plane) of the columns 42*b*.

In general, the mutual spacing of the columns 42*a*, 42*b* is designed of such a value as to allow a top closure of the trenches 38 during the epitaxial growth step described with reference to FIG. 2D.

After the formation of the columns 42*a*, 42*b*, the mask 32 is removed.

Figure 2D:
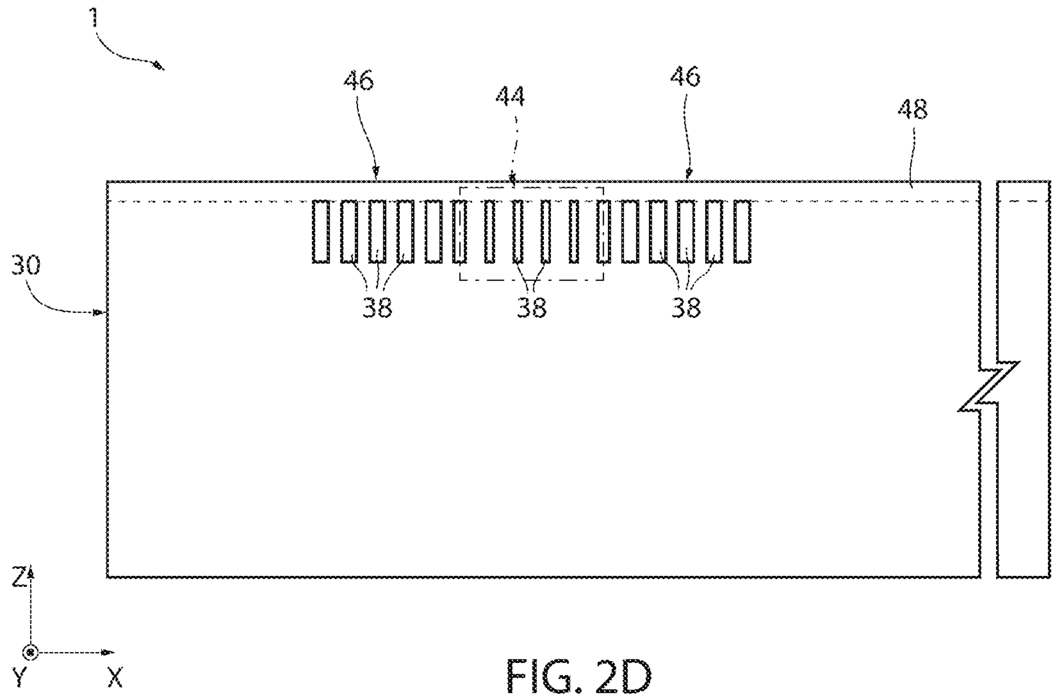

With reference to FIG. 2D, an epitaxial growth is performed in a deoxidizing environment (typically, in an atmosphere having a high concentration of hydrogen, preferably using trichlorosilane-$SiHCl_3$). The epitaxial growth is performed at least until the trenches 38 are closed upwardly (for example, for 45 seconds at a temperature close to 1200° C.).

Consequently, an epitaxial layer 48 grows above the silicon columns 42*a*, 42*b*, closes the trenches 38 upwardly and traps therein the gas present (here, molecules of hydrogen $H_2$).

An annealing step is then performed, for example for about 30-40 minutes at a temperature of about 1190-1200° C. The annealing step causes, FIG. 2E, a migration of the silicon atoms which tend to move to the lower energy position, in a per se known manner, as for example discussed in the article by T. Sato, N. Aoki, I. Mizushima and Y. Tsunashima, "A New Substrate Engineering for the Formation of Empty Space in Silicon (ESS) Induced by Silicon Surface Migration," IEDM 1999, pp. 517-520.

At the trenches 38, where the silicon columns are close to each other, the silicon atoms migrate and form the cavity 20 closed upwardly by the epitaxial layer 48 (which, now, forms the membrane 10).

Preferably, the annealing is performed in an $H_2$ atmosphere so as to prevent the hydrogen present in the trenches 38 from escaping through the epitaxial layer towards the outside and to increase the concentration of hydrogen present in the cavity 20 if that trapped during the epitaxial growth step were not sufficient. Alternatively, the annealing may be carried out in a nitrogen environment.

Figure 2E:
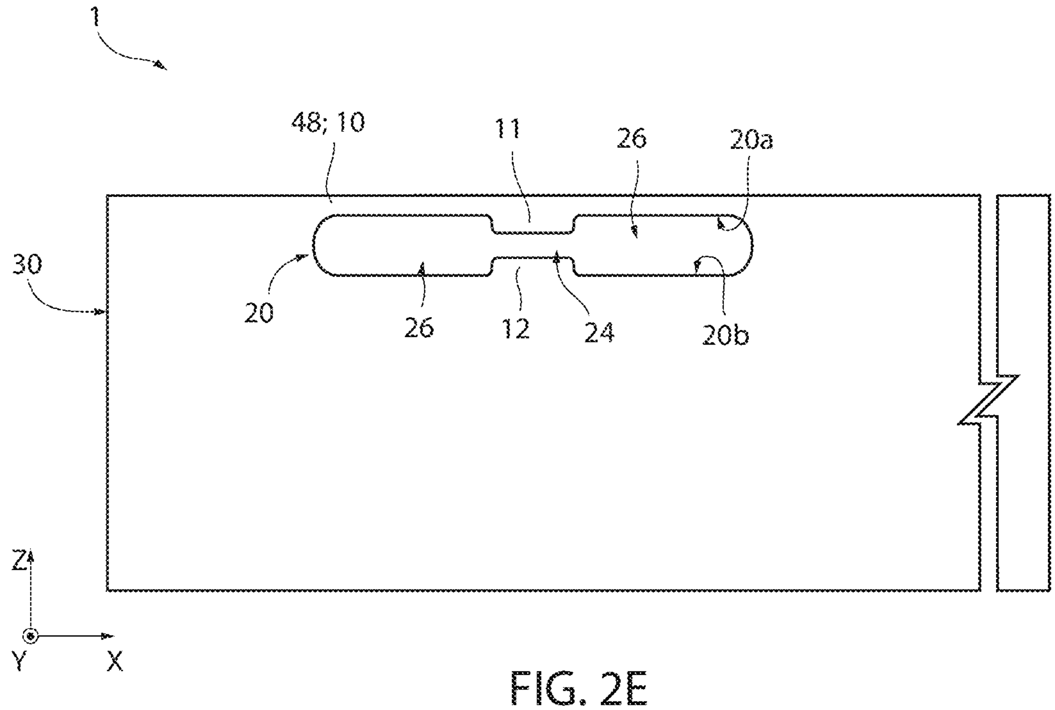

The different shape and mutual distance between the silicon columns, in the portions 44 and 46 of the semiconductor body 30, entails that the migration of the atoms during the annealing step of FIG. 2E causes the formation of the cavity 20 as described with reference to FIG. 1, i.e., it leads to the formation of the bumps 11 and 12.

In practice, forming the buried cavity 20 comprises concurrently forming different types of cavities, or sub-cavities, joined to each other and in mutual connection. A first type of sub-cavity 24 is formed at the portion 44 and has a maximum extension, along the Z axis, lower than the maximum extension, again along the Z axis, of a second type of sub-cavity 26 which is formed at the portion 46. The sub-cavities 24 and 26 are in connection to each other and their typological division is qualitative and not clear-cut. According to the present disclosure, at the sub-cavity 24, the bumps 11, 12 are formed which tend to partially occlude, or locally narrow, the buried cavity 20.

The formation of the first bump 11 at the side 20*a* delimits the cavity 20 upwardly, and of the second bump 12 at the side 20*b* that delimits the cavity 20 downwardly as a direct consequence of the different mutual arrangement and dimension of the silicon columns 42*a*, 42*b* and corresponding trenches 38 separating them. Where the silicon columns have a greater base area and are closer to each other (i.e., at the silicon columns 42*a*) there is formed the sub-cavity 24, with dimension $d_1$ along the Z axis reduced due to the presence of the bumps 11, 12; where the silicon columns have a smaller base area and are more spaced from each other (i.e., at the silicon columns 42*b*), there is formed the sub-cavity 26, with dimension $d_2$ along the Z axis greater than the corresponding dimension $d_1$ of the sub-cavity 24, as it has no bumps 11, 12.

For example, it is $d_1$=1.5-2 μm and $d_2$=2.1-2.5 μm.

Although the Figures illustrate, for sake of simplicity, bumps 11, 12 having the same thickness along the Z axis, the advantageous effect of the present disclosure would be obtained even if (by variation in the process parameters) a bump protruded from the respective side for a maximum thickness, along Z, greater than the corresponding maximum thickness of the other bump. Similarly, one of the bumps 11 and 12 might not be present.

Figure 3:
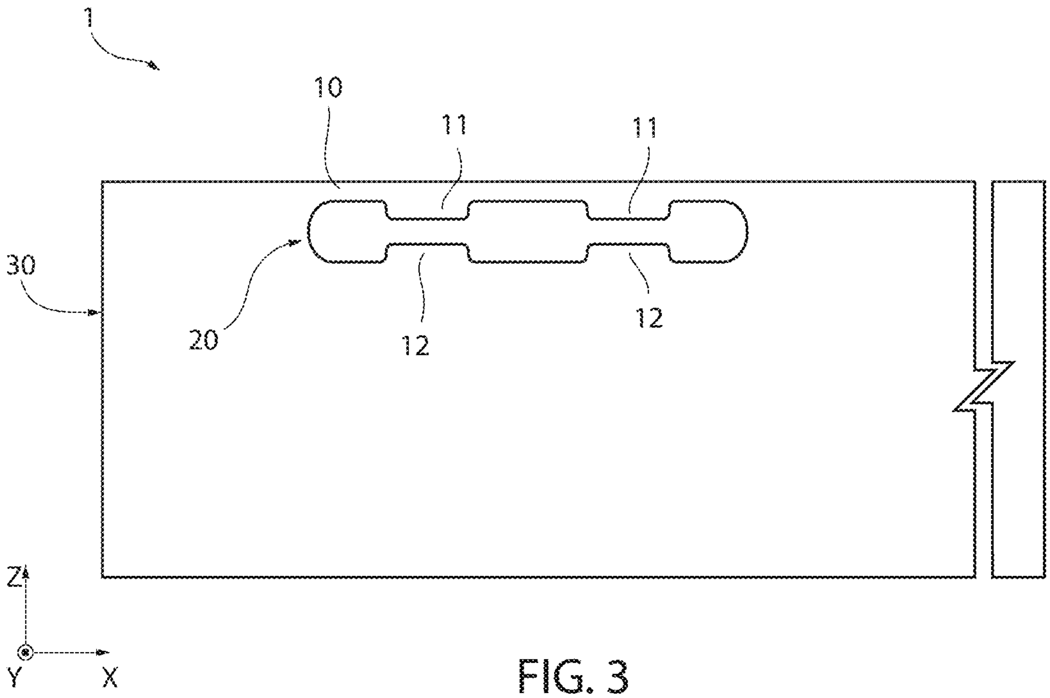
FIG. 3 illustrates, in lateral sectional view, a micromechanical structure according to a further embodiment of the present disclosure.

FIG. 3 illustrates, according to a further embodiment, the semiconductor body 30 including the membrane 10 and the cavity 20, wherein the cavity 20 accommodated therein a plurality of bumps 11 (at the top side 20*a*) and a plurality of bumps 12 (at the bottom side 20*b*). In this embodiment, the bumps 11 and 12 are formed as described with reference to FIGS. 2A-2E.

FIGS. 4A-4E illustrate a method for manufacturing the wafer 1 of FIG. 1, in particular for forming the bumps 11, 12, according to an alternative embodiment with respect to that of FIGS. 2A-2E. As previously noted, what has been described applies similarly to the processing of a die. At the end of the processing steps of the wafer 1, this may be diced to isolate a plurality of dies or chips manufactured simultaneously as described herein.

Figure 4A:
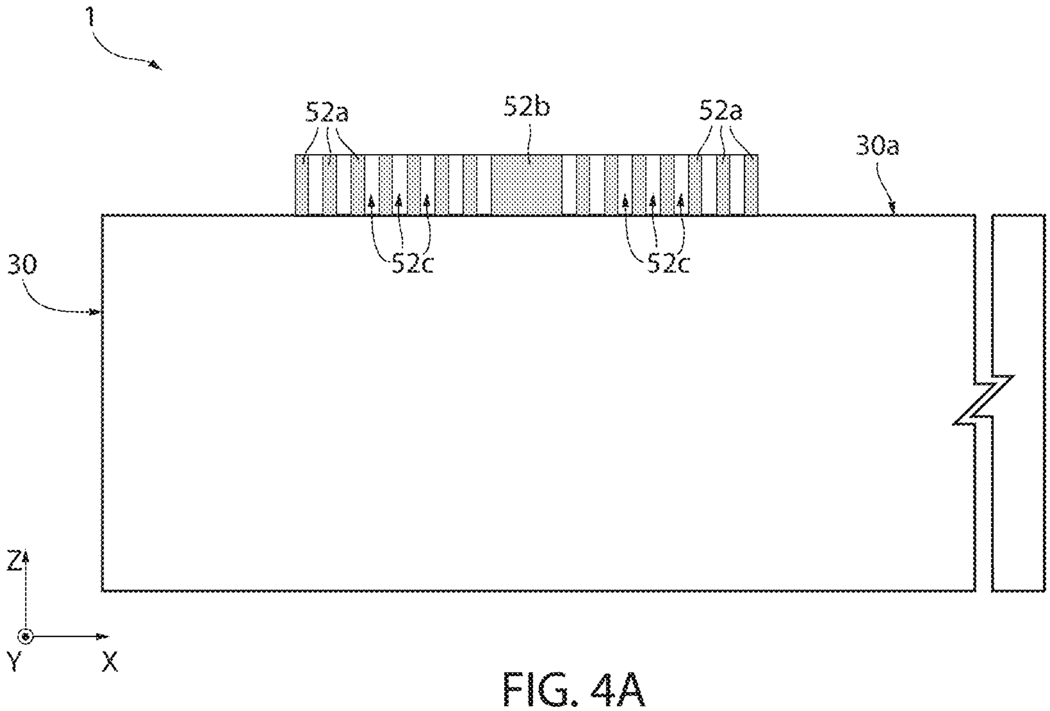
FIGS. 4A-4E illustrate steps of a manufacturing process of the micromechanical structure of FIG. 3.
Figure 4B:
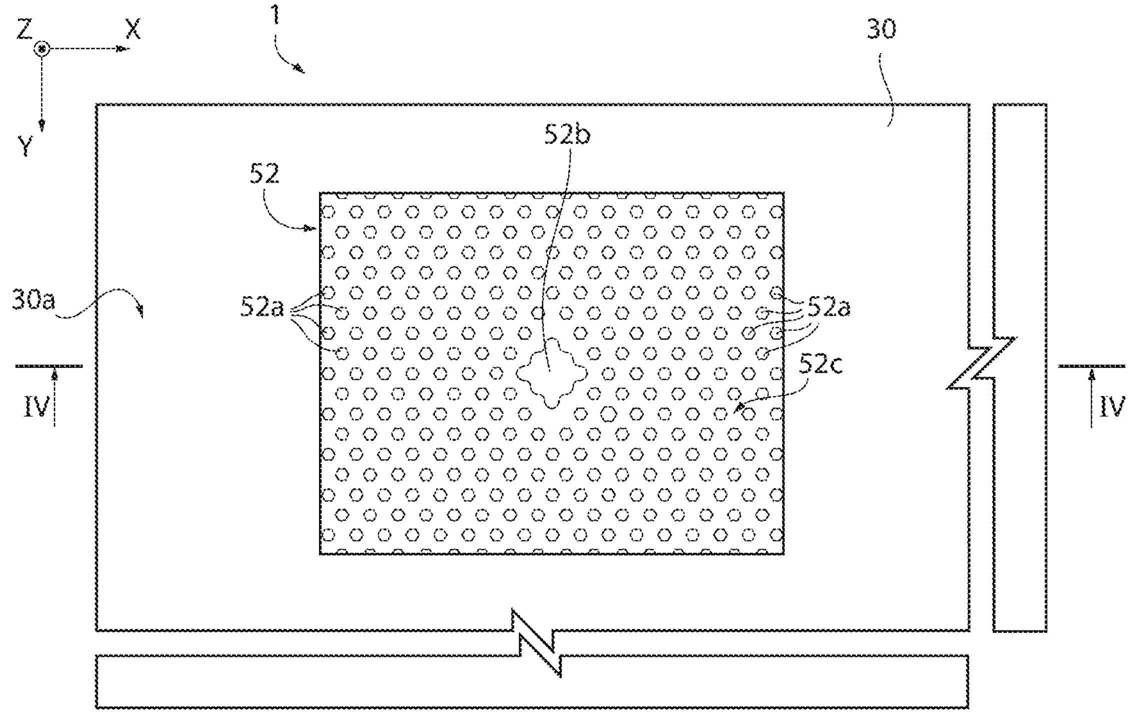

With joint reference to FIG. 4A (in lateral sectional view) and to FIG. 4B (in XY plane top view), the wafer 1 comprises the semiconductor body 30 (possibly previously processed, as needed, for example including a monocrystalline silicon epitaxial layer grown on a monocrystalline silicon substrate). The view of FIG. 4A is along section line IV-IV of FIG. 4B.

A photoresist mask 52 is provided above the top surface 30*a* of the semiconductor body 30 by a photolithography step. The mask 52 is formed at regions of the semiconductor body 30 wherein it is desired to form the buried cavity 20 and, consequently, the membrane 10 suspended thereon.

The mask 52 defines a honeycomb lattice, having mask regions 52*a* for example of hexagonal shape, close to each other and separated from each other by through openings 52*c* extending through the entire thickness of the mask 52. A second mask region 52*b* has no through openings 52*c*.

In particular, the first and the second mask regions 52*a*, 52*b* are regions wherein the photoresist material is physically present ("full" regions); the through openings 52*c* are regions wherein the photoresist material has been removed ("empty" regions) by the photolithographic process, having the top surface 30*a* of the semiconductor body 30 exposed therethrough.

The first mask regions 52*a* have, in top view, a first value of base area; the second mask region 52*b* has, in top view, a second value of base area, greater than the first value of base area.

In other words, according to an aspect of the present disclosure, the portion of the mask 52 wherein the first mask regions 52*a* are present has a full/empty ratio of the type already described for the portion 36 of the mask 32 of FIG. 2A or 2B. The portion of the mask 52 wherein the second mask region 52*b* is present has no empty spaces.

By way of example, the first mask regions 52*a* have a hexagonal shape and diameter (both along the X and Y axis) in the range 1.8-2.1 μm, and are separated from each other by a gap 32*c* having extension (both along the X and Y axis) in the range 0.9-1.2 μm.

Figure 5A:
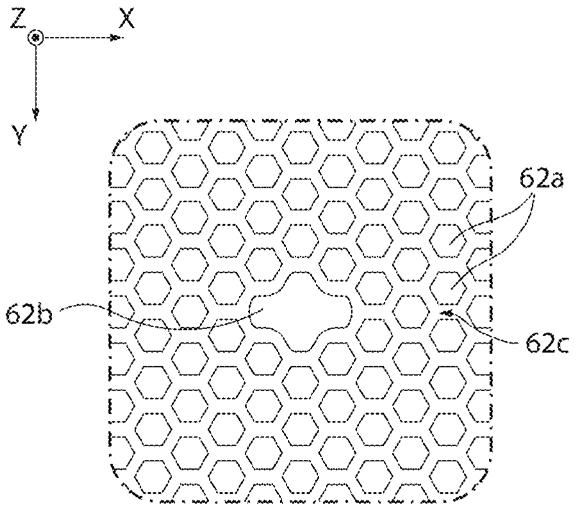
FIGS. 5A-5C illustrate, in plan view, a layout of the micromechanical structure of FIG. 3 in an intermediate manufacturing step.
Figure 5B:
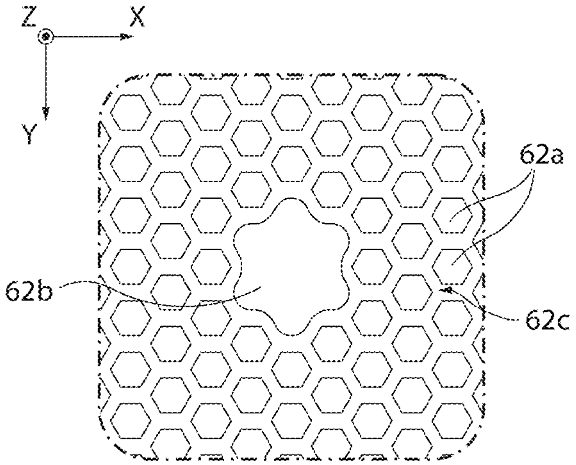
Figure 5C:
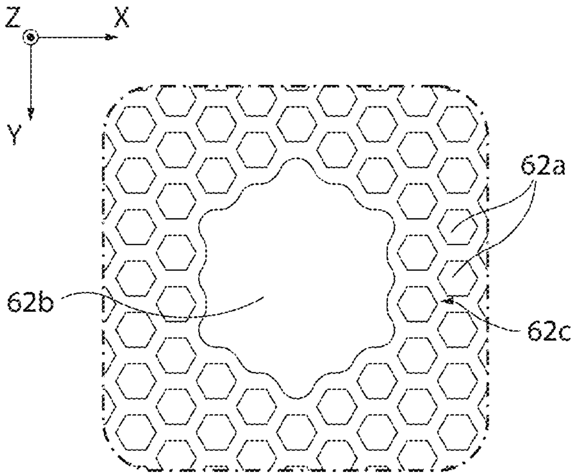

The second mask region 52*b* has any shape (e.g., generically polygonal), chosen during the design step, for example of the type illustrated in FIGS. 5A-5C according to the respective embodiments.

Figure 4C:
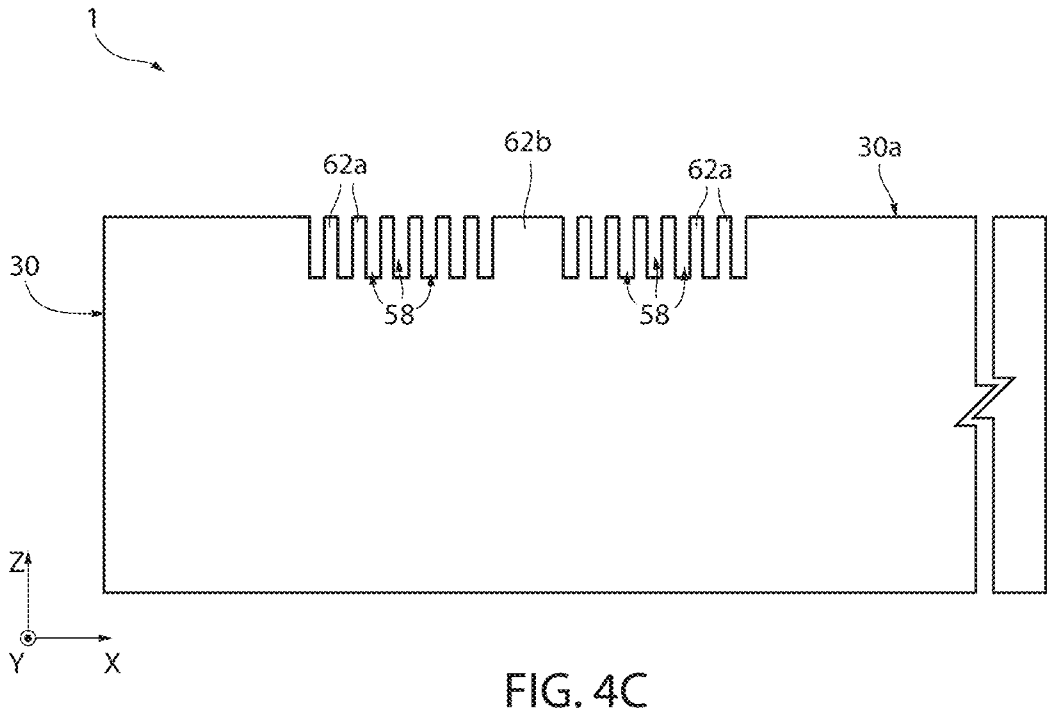

By using the mask 52, FIG. 4C, an etching of the semiconductor body 30 is performed, forming trenches 58 having depths, along the Z axis, of a few micrometers, for example depth comprised between 0.5 μm and 50 μm. The trenches 58 define columns 62*a,* 62*b* of silicon having a shape corresponding to the shape of the regions 52*a,* 52*b* defined by the mask 52. Therefore, also in the semiconductor body 30 silicon columns 62*a* are formed which have shape, dimensions and mutual distance uniform to each other, as determined by the first mask region 52*a;* similarly, a single silicon column 62*b* is formed, contiguous to the silicon columns 62*a* (in particular, surrounded by the silicon columns 62*a,* at a distance determined by the trenches 58), which has a shape and dimensions defined by the second mask region 52*b*.

Each column 62*a* has, for example, a hexagonal shape with a diameter equal to about 2 μm, and is separated from an adjacent column 62*a,* along X and along Y, by about 1 μm. In general, diameter and spacing of the columns 62*a* are designed of such a value as to allow a top closure of the trenches 58 during the epitaxial growth step described with reference to FIG. 4D.

After the formation of the columns 62*a,* 62*b,* the mask 52 is removed.

Figure 4D:
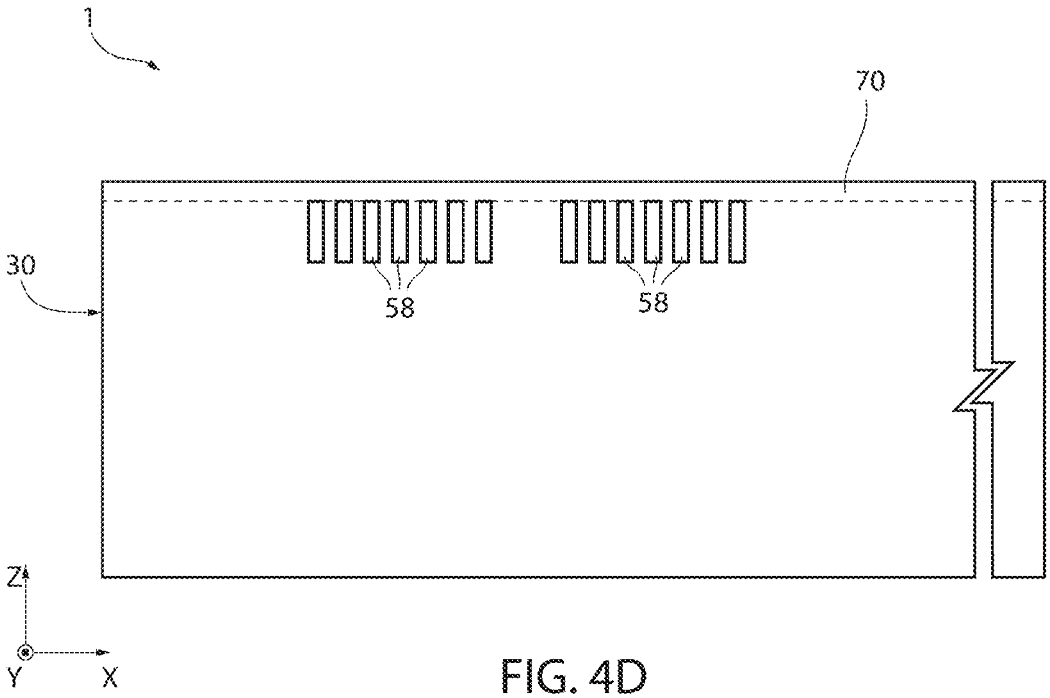

With reference to FIG. 4D, an epitaxial growth is performed in a deoxidizing environment (typically, in an atmosphere having a high concentration of hydrogen, preferably using trichlorosilane-$SiHCl_3$). The epitaxial growth is performed at least until the trenches 58 are closed upwardly (for example, for 45 seconds at a temperature close to 1200° C.).

Consequently, an epitaxial layer 70 grows above the silicon columns 62*a,* 62*b,* closes the trenches 58 upwardly and traps therein the gas present (here, molecules of hydrogen $H_2$).

An annealing step is then performed, for example for about 30-40 minutes at a temperature of about 1190-1200° C. The annealing step causes, FIG. 4E, a migration of the silicon atoms which tend to move to the lower energy position, in a per se known manner, as for example discussed in the article by T. Sato, N. Aoki, I. Mizushima and Y. Tsunashima, "A New Substrate Engineering for the Formation of Empty Space in Silicon (ESS) Induced by Silicon Surface Migration," IEDM 1999, pp. 517-520.

At the trenches 58, where the silicon columns are close to each other, the silicon atoms migrate and form the cavity 20 closed upwardly by the epitaxial layer 70 (which, now, forms the membrane 10).

Preferably, the annealing is performed in an $H_2$ atmosphere so as to prevent the hydrogen present in the trenches 58 from escaping through the epitaxial layer towards the outside and to increase the concentration of hydrogen present in the cavity 20 if that trapped during the epitaxial growth step were not sufficient. Alternatively, the annealing may be carried out in a nitrogen environment.

The mutual distance between the silicon columns 62*a,* and the distance between the silicon columns 62*a* and the silicon column 62*b,* entails that the migration of the atoms during the annealing step of FIG. 4E shapes the cavity 20 in analogy to what has been described with reference to FIG. 1, i.e., leads to the formation of the bumps 11 and 12.

Similarly to what has been previously observed, forming the buried cavity 20 comprises concurrently forming different types of cavities, or sub-cavities, joined to each other and in mutual connection. A first type of sub-cavity 74 is formed at the silicon column 62*b,* and a second type of sub-cavity 75 is formed at the silicon columns 62*a*. The sub-cavity 74 of the first type has a maximum extension, along the Z axis, lower than the maximum extension, along the Z axis, of the second type of sub-cavity 75. The typological division among the sub-cavities of different type is qualitative and not clear-cut. According to the present disclosure, the bumps 11, 12 are formed at the sub-cavity 74 of the first type and tend to partially occlude, or locally narrow, the buried cavity 20.

Figure 4E:
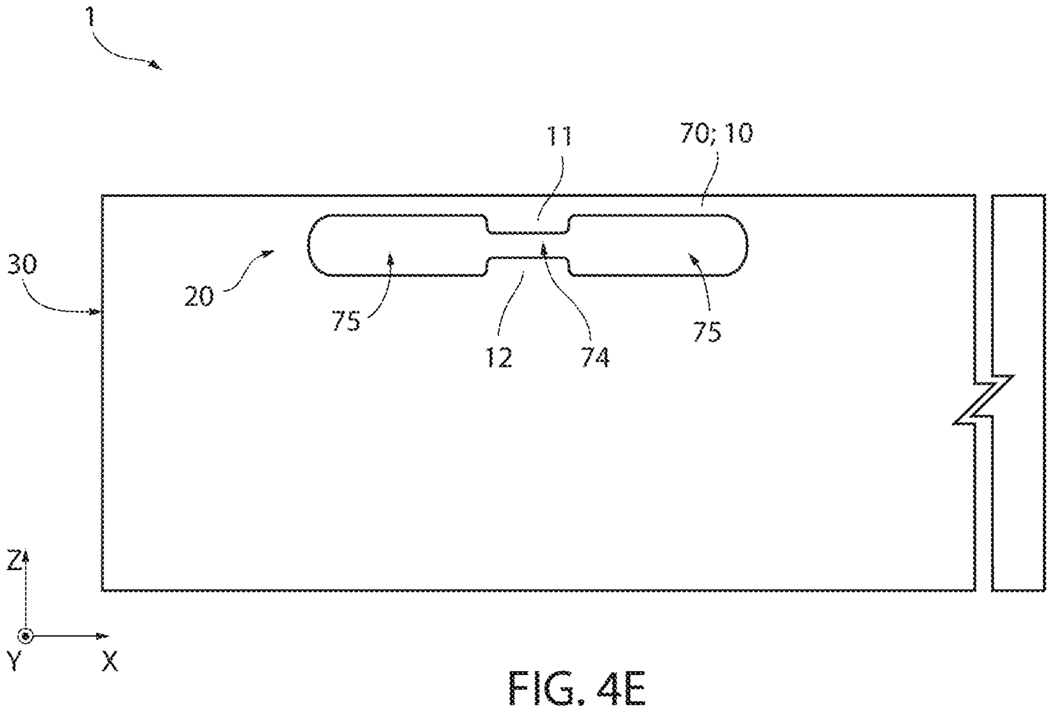

Although FIG. 4E illustrates, for simplicity of representation, bumps 11, 12 having the same thickness along the Z axis, the advantageous effect of the present disclosure would be obtained even if (by variation in the process parameters) one of the bumps 11, 12 protruded from the respective side for a maximum thickness, along Z, greater than the corresponding maximum thickness of the other bump 11, 12. Similarly, one of the bumps 11 and 12 might be absent.

FIG. 5A illustrates, in XY plane view, a layout of the column, or pillar, 62*b*. In this embodiment, the column 62*b* has the shape of a four-pointed "star" or of a "cross," of maximum dimension (from tip to tip), along X and along Y equal to a few micrometers, for example 7 μm along the X axis and 5 μm along the Y axis. The silicon columns 62*a,* 62*b* are separated by a gap 62*c*.

FIG. 5B illustrates, in XY plane view, a further layout of the column, or pillar, 62*b*. In this embodiment, the column 62*b* has the shape of a six-pointed "star," and for example maximum dimension (from tip to tip), along Y equal for example to 8 μm and minimum dimension, along X, equal for example to 6 μm.

FIG. 5C illustrates, in XY plane view, a further layout of the column, or pillar, 62*b*. In this embodiment, the column 62*b* has the shape of a twelve-pointed "star" or "flower," and the maximum dimension (from tip to tip), along X or along Y, comprised for example between 12 and 14 μm.

FIGS. 6A-6G illustrate a manufacturing method of the wafer 1, in particular of the membrane 10 suspended on the buried cavity 20 which includes at least the bump 11, according to a further embodiment of the present disclosure. As previously noted, what has been described applies similarly to the processing of a die. At the end of the processing steps of the wafer 1, this may be diced to isolate a plurality of dies or chips manufactured simultaneously as described herein.

Figure 6A:
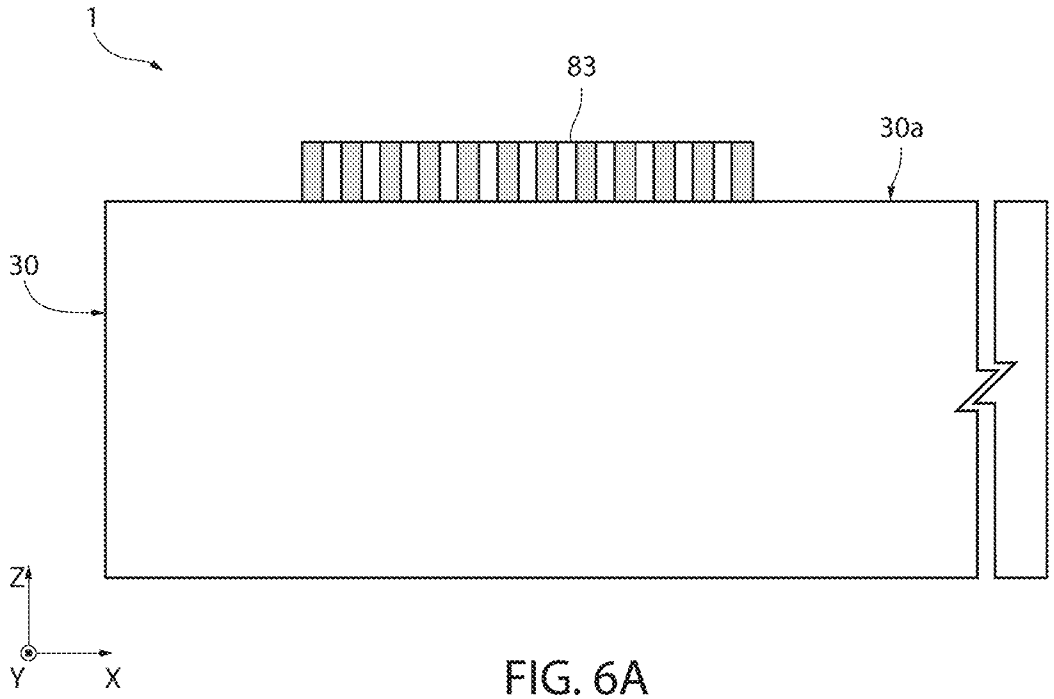
FIGS. 6A-6G illustrate steps of a manufacturing process of the micromechanical structure of FIG. 1 or FIG. 3 according to a further embodiment of the present disclosure.
Figure 6B:
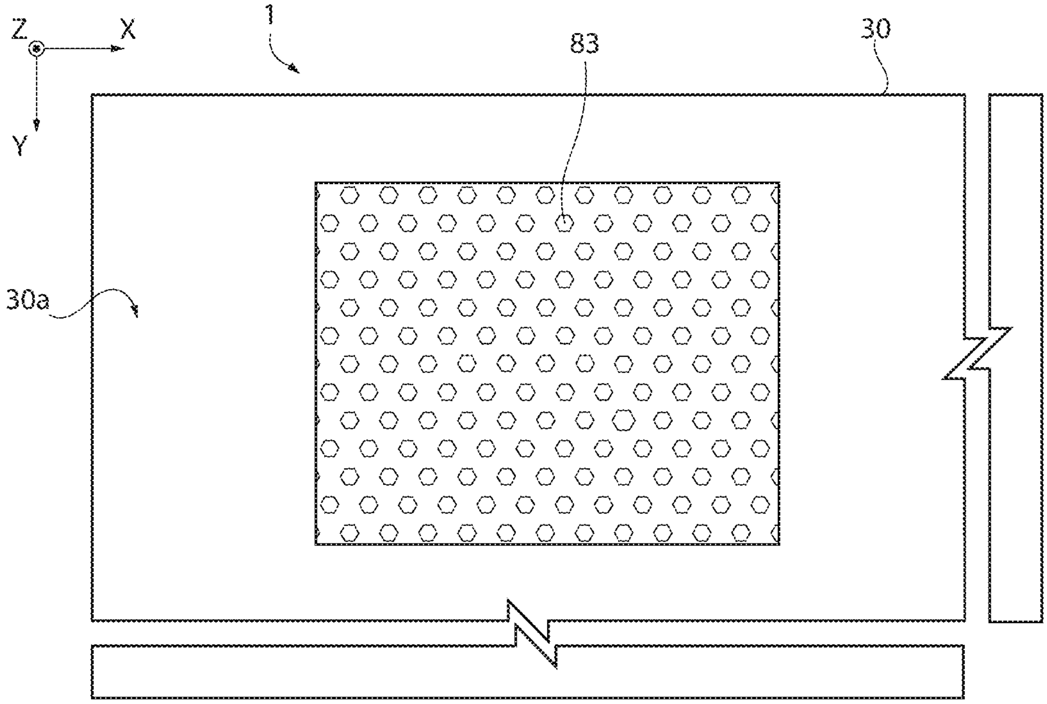

With joint reference to FIG. 6A (in lateral sectional view) and to FIG. 6B (in top view), the wafer 1 comprises the semiconductor body 30, here of monocrystalline silicon. A photoresist mask 83 is provided above the top surface 30*a* of the semiconductor body 30 by a photolithography step. The mask 83 is formed at regions of the semiconductor body 30 wherein it is desired to form the cavity 20.

The mask 83 defines a honeycomb lattice, having mask regions, for example of a hexagonal shape, close to each other.

Figure 6C:
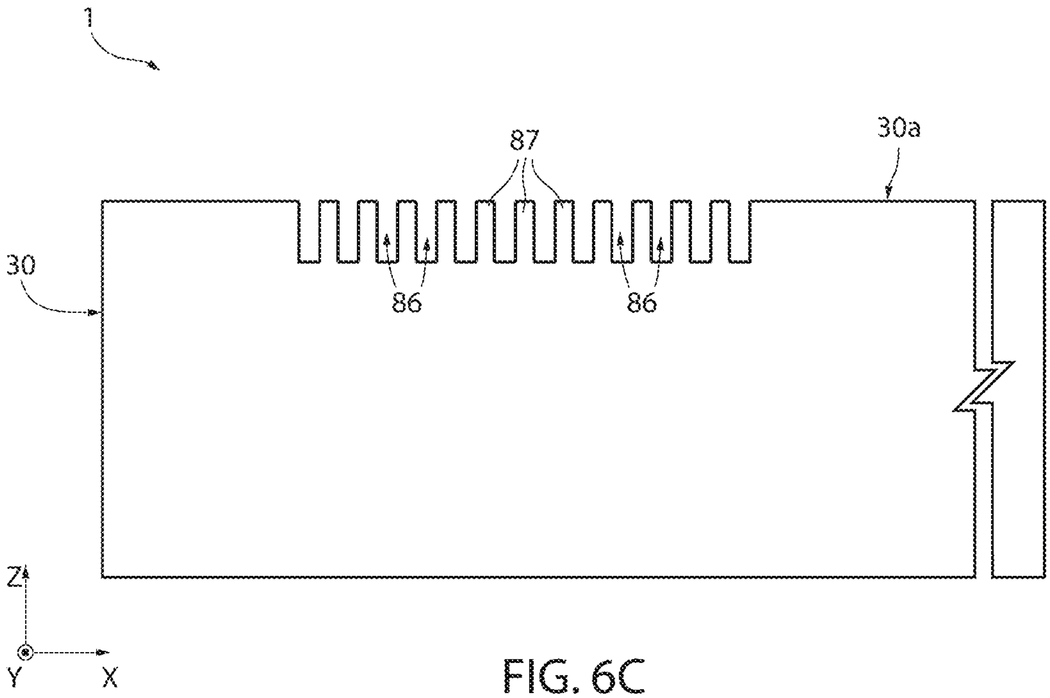

By using the mask 83, FIG. 6C, an etching of the semiconductor body 30 is performed, forming trenches 86 having depths of a few micrometers, for example comprised between 5 μm and 25 μm. The trenches 86 define silicon columns 87 substantially equal to each other and of a shape corresponding to the shape of the honeycomb regions defined by the mask 83. Exemplarily, each column 87 has a diameter equal to about 1 μm and is separated from an adjacent column, along X or along Y, by about 1 μm. In general, diameter and spacing of the columns 87 are chosen of such a value as to allow a top closure of the trenches 86 during the epitaxial growth step described hereinbelow.

Figure 6D:
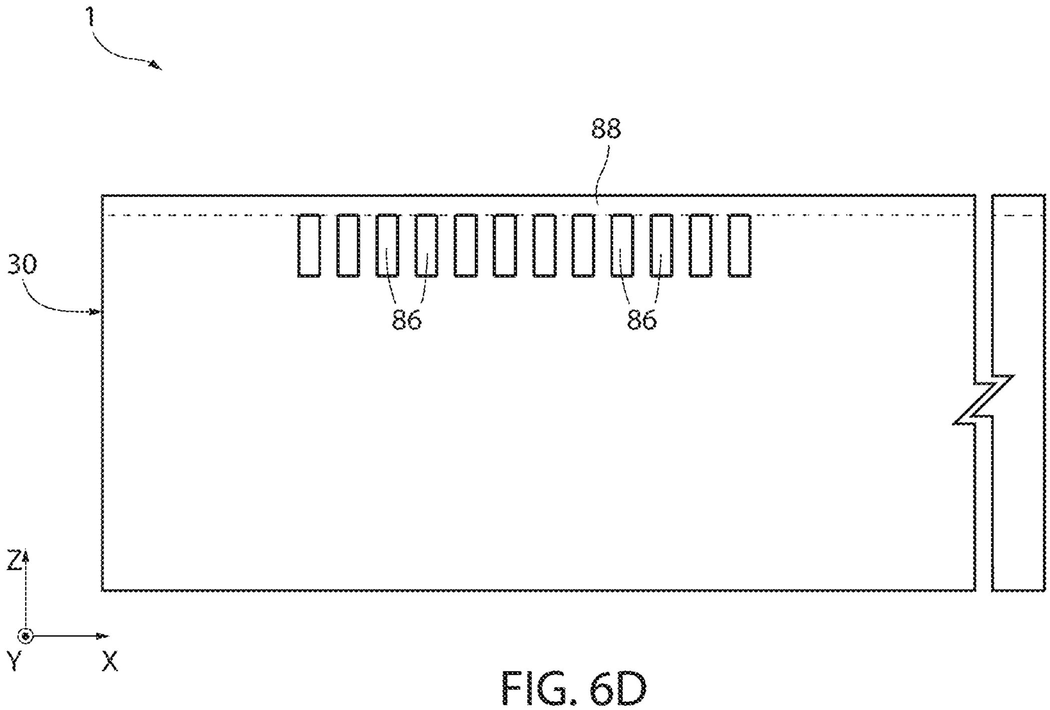
Figure 6E:
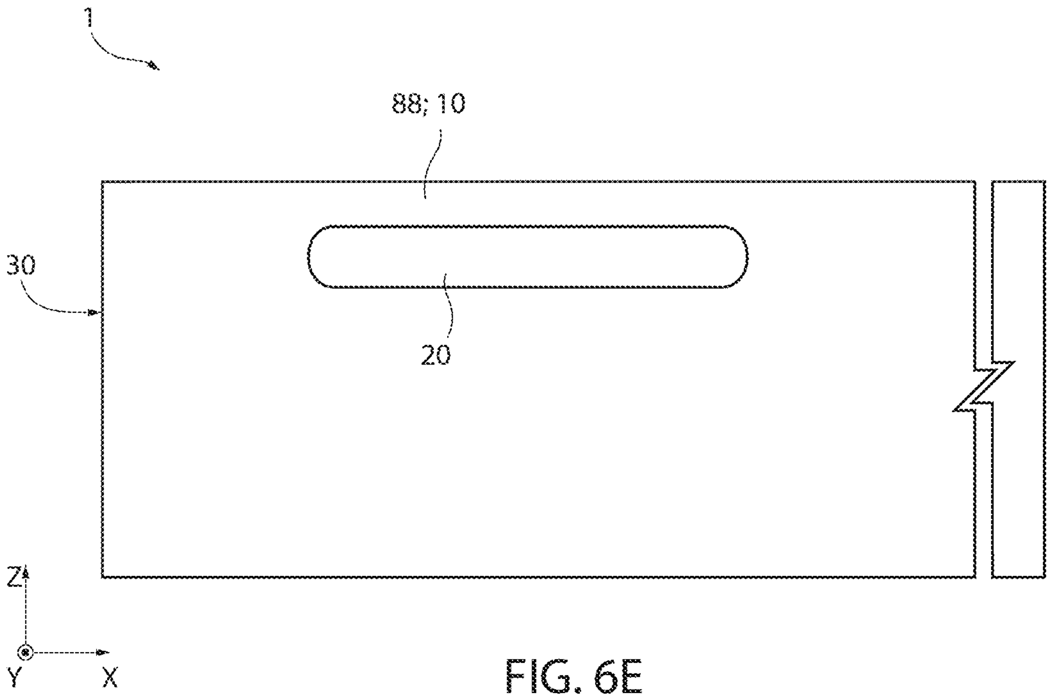

Subsequently, FIG. 6D, the mask 83 is removed and an epitaxial growth is performed in a deoxidizing environment (typically, in an atmosphere having a high concentration of hydrogen, preferably using trichlorosilane-$SiHCl_3$). The epitaxial growth is performed at least until the trenches 86 are closed upwardly (for example, for 45 seconds at a temperature close to 1200° C.).

Consequently, a sealing layer 88 (hereinafter forming, at least in part, the membrane 10), is grown epitaxially above the silicon columns 87; the sealing layer 88 closes the trenches 86 upwardly and traps therein the gas present (here, molecules of hydrogen $H_2$).

An annealing step is then performed, for example for about 30-40 minutes at a temperature of about 1190-1200° C. The annealing step causes, FIG. 6E, a migration of the silicon atoms which tend to move to the lower energy position, in a per se known manner, as for example discussed in the article by T. Sato, N. Aoki, I. Mizushima and Y. Tsunashima, "A New Substrate Engineering for the Formation of Empty Space in Silicon (ESS) Induced by Silicon Surface Migration," IEDM 1999, pp. 517-520.

At the trenches 86, where the silicon columns are close to each other, the silicon atoms migrate completely and form the cavity 20, closed upwardly by the sealing layer 88, of Silicon.

Preferably, the annealing is performed in an $H_2$ atmosphere so as to prevent the hydrogen present in the trenches 86 from escaping through the epitaxial layer towards the outside and to increase the concentration of hydrogen present in the cavity 20 if that trapped during the epitaxial growth step were not sufficient. Alternatively, the annealing may be carried out in a nitrogen environment.

Figure 6F:
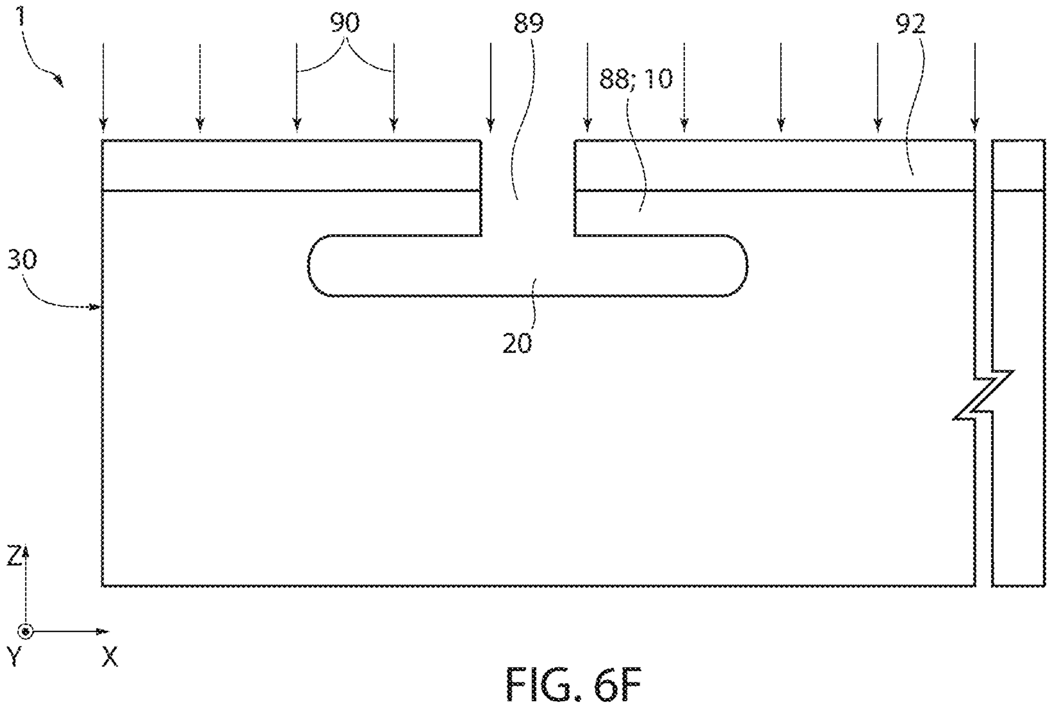

Then, FIG. 6F, the sealing layer 88 is selectively removed at a portion thereof wherein the bump 11 is intended to be formed. To this end, a chemical etching (arrows 90 in FIG. 6F) is performed using an etching mask 92 to form an opening 89 passing through the entire thickness of the sealing layer 88. The through opening 89 reaches the cavity 20, putting it in connection with the external environment.

The through opening 89 has, for example, a circular or generically polygonal shape in XY plane view, for example with a diameter comprised between 0.1 and 5 μm, more particularly between 0.1 and 1 μm, even more particularly between 0.1 and 0.3 μm. The through opening 89 may also have irregular shapes, or for example one of the shapes and dimensions illustrated in FIGS. 5A-5C for the element 62*b*.

Figure 6G:
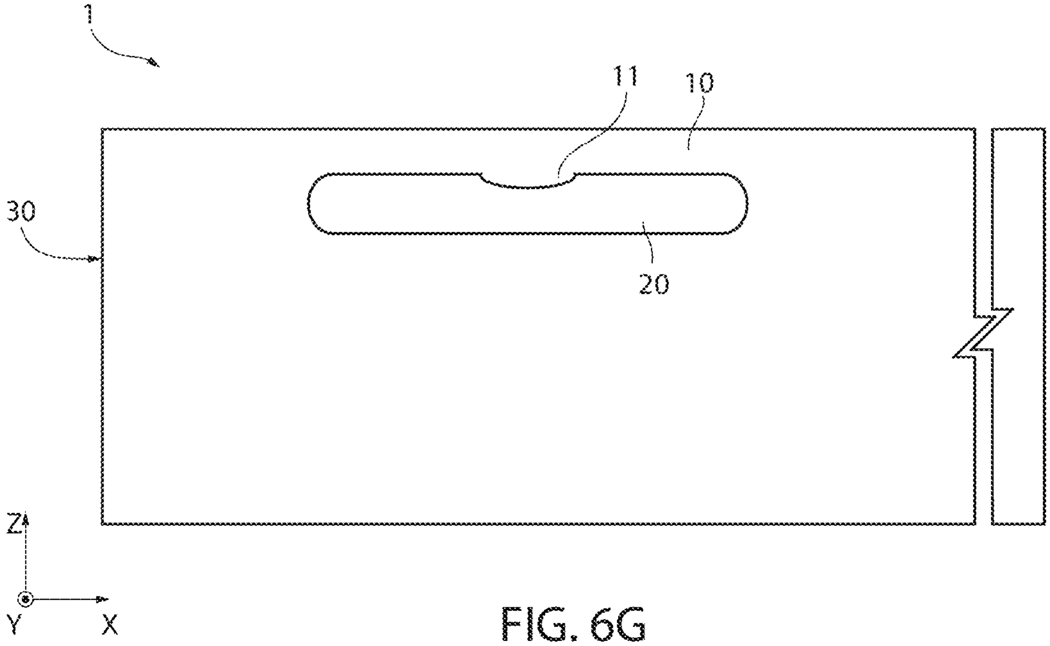

Then, FIG. 6G, an epitaxial growth step is performed at the sealing layer 88, such that it closes the through opening 89 thus isolating the cavity 20 from the external environment. In an initial step of the epitaxial growth, the Silicon also grows epitaxially towards the inside of the cavity 20, at the through opening 89, forming a protuberance that extends towards the inside of the cavity 20. By continuing the epitaxial growth, the through opening 89 closes and this protuberance forms the bump 11. The cavity 20, at the end of the method, is buried in the semiconductor body 30 and its internal pressure is defined by the pressure present in the reaction chamber during the epitaxial growth leading to the formation of the bump 11.

By forming a plurality of through openings similar to the through opening 89 it is possible to form a respective plurality of bumps.

The membrane 10 may be thinned, if necessary, for example by Chemical Mechanical Polishing (CMP) technique.

Figure 7A:
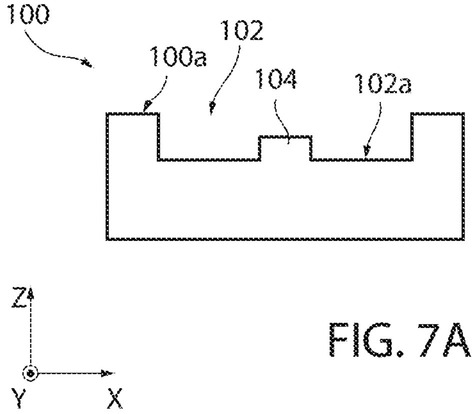
FIGS. 7A-7C illustrate a manufacturing method of the micromechanical structure of FIG. 1 or FIG. 3 according to a further embodiment of the present disclosure.
Figure 7B:
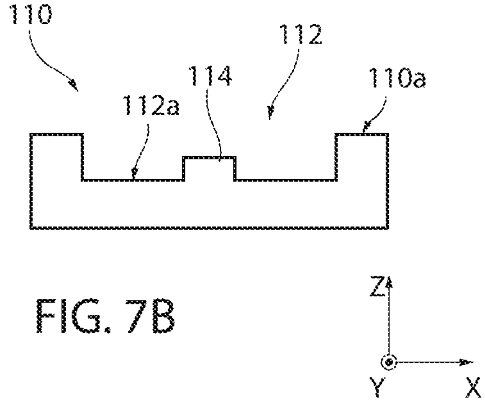
Figure 7C:
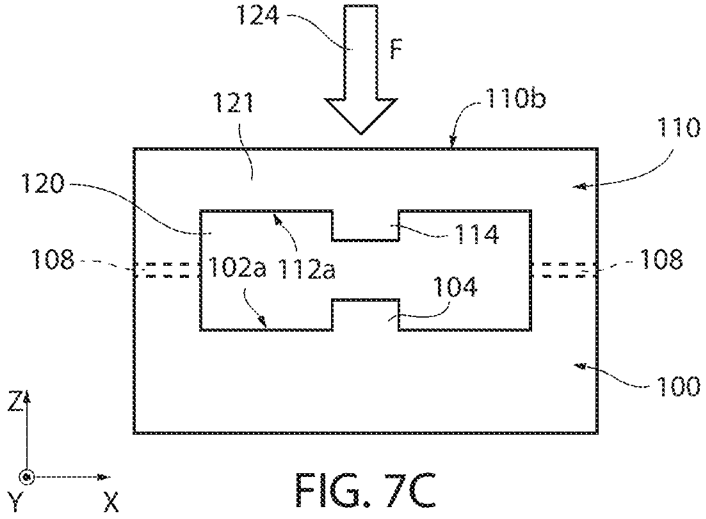

FIGS. 7A-7C illustrate a further technical solution for manufacturing a buried cavity provided with one or more bumps. FIGS. 7A-7C are illustrated in a triaxial reference system of X, Y, Z axes orthogonal to each other. Reference will be made hereinafter to the processing of wafers;

however, what has been described applies similarly to the processing of portions of a semiconductor wafer, for example dies. Similarly, at the end of the processing steps of the wafers, these may be diced ("dicing" operation) to isolate a plurality of dies or chips manufactured simultaneously as described herein.

With reference to FIG. 7A, a first wafer 100 of semiconductor material, for example of Silicon, is shaped so as to form, at one front side 100*a* thereof, a recess 102 having a bottom side 102*a*. The bottom side 102*a* has a protuberance, or bump, 104, for example having a circular, polygonal or irregular shape, which extends moving away from the bottom side 102*a*. The bump 104 may have one of the shapes described and illustrated with reference to FIGS. 5A-5C for the element 62*b*. The bump 104 extends, from the bottom side 102*a*, for a height, along the Z axis, comprised between 0.01 and 1 μm (in particular between 0.1 and 1 μm).

With reference to FIG. 7B, a second wafer 110 of semiconductor material is arranged, having a front side 110*a* and a rear side 110*b* opposite to each other along the Z axis. The second wafer 110 is for example of Silicon. The second wafer 110 is shaped so as to form, at the front side 110*a*, a recess 112 having a bottom side 112*a*. The bottom side 112*a* has a protuberance, or bump, 114, for example having a circular, polygonal or irregular shape. The bump 114 may have one of the shapes described and illustrated with reference to FIGS. 5A-5C for the element 62*b*. The bump 114 extends, from the bottom side 112*a*, for a height, along the Z axis, comprised between 0.01 and 1 μm (in particular between 0.1 and 1 μm).

The bumps 104 and 114 are formed in such a way that, when the first and the second wafers 100, 110 are coupled to each other as described with reference to FIG. 7C, the bumps 104 and 114 are at least partially aligned with each other along the direction of the Z axis.

Then, FIG. 7C, the first wafer 100 and the second wafer 110 are coupled to each other at coupling regions 108 extending laterally to (i.e., surrounding) the recesses 102, 112. The coupling may be carried out by per se known wafer-to-wafer bonding techniques. For example, it is possible to use glue, double-sided adhesive layers, glass frit, etc. The coupling between the wafers 100, 110 is performed in such a way that the recesses 102, 112 form, together, a cavity 120 fluidically isolated from the external environment.

The second wafer 110 thus forms, at its rear side 110*b*, a membrane 121 suspended on the cavity 120. It is possible to thin the second wafer 110 at the rear side 110*b* to obtain a desired thickness for the membrane 121.

The membrane 121 is for bending when a suitable external force F is applied along the Z direction as identified by arrow 124. At rest, when no external force F acts on the membrane 121, the membrane 121 is substantially parallel to the XY plane. In the presence of a suitable force F, the membrane 121 bends, and, as the force F increases, the membrane 121 bends up to a maximum bending point wherein the bumps 104, 114 are in mutual contact.

The bumps 104, 114 operate, in this context, as antistiction structures, minimizing the risk of irreversible stiction between the opposite sides 102*a*, 112*a* internal to the cavity 120 when, during use, the opposite sides 102*a*, 112*a* come close to each other. In fact, according to the present disclosure, the contact occurs exclusively between the bumps 104, 114 which have a reduced contact surface and, therefore, also the stiction forces are consequently reduced.

Figure 8A:
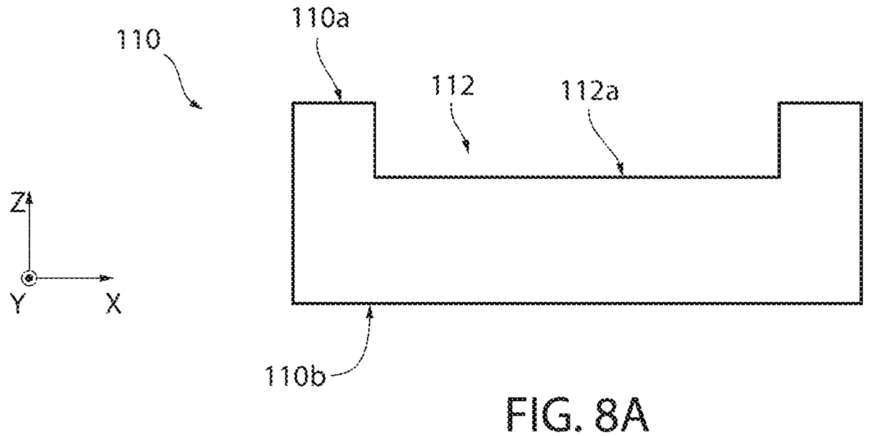
FIGS. 8A and 8B illustrate a variant of the manufacturing method of FIGS. 7A-7C.
Figure 8B:
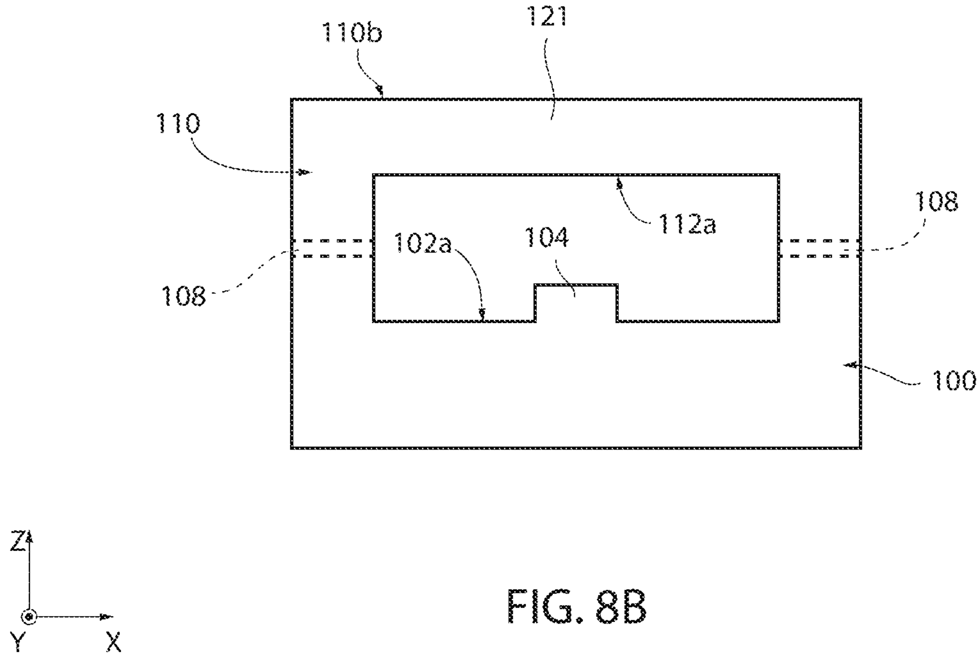

In a further embodiment illustrated in FIGS. 8A and 8B (where elements common to FIGS. 7A-7C are illustrated with the same reference numbers and are not further described), the second wafer 110 is shaped so as not to have the bump 114. In this case, when the first and the second wafers 100, 110 are coupled to each other (FIG. 8B), for example according to the previously described techniques, the cavity 120 accommodates the sole bump 104.

It is apparent that, according to further embodiments, not illustrated, one of or both the first and the second wafers 100, 110 may be shaped so as to have a plurality of bumps 104 and/or a plurality of bumps 114, with shapes and dimensions equal to or different from each other.

The present disclosure, regardless of the embodiment, may find application as a pressure sensor (in particular of differential type), or as a fluidic micro-valve or fluidic micro-pump with an actuation that is, in particular, piezoelectric.

The transduction of the signal applied on the membrane 10, 110 (force F) may occur according to any of the known techniques, for example by forming piezoresistors on the membrane 10, 110, or in proximity thereto, in a manner known per se and not an object of the present disclosure. In particular, for providing a piezoelectric-type pressure sensor it is sufficient, during the final manufacturing steps, for example while providing the components of the control circuitry, to provide piezoresistive elements in proximity of the periphery of the same membrane 10, 121. Preferably, the piezoresistive elements have P-type conductivity and the membrane has N-type conductivity (the electrical conductivities are obtained by implanting dopant species, in a per se known manner). Alternatively, the piezoresistors may be made of polysilicon above the membrane.

The embodiment of FIGS. 7A-7C, or 8A-8B, is suitable for manufacturing a capacitive pressure sensor, using coupling regions 108 which electrically insulate the two wafers 100, 110 which form the two electrons, or plates, of a capacitor. By applying a pressure on the membrane 121, it deflects, reducing its distance from the bottom electrode (wafer 100). As a result, the capacitance of the sensing capacitor increases. By measuring this capacitance variation, an indication of the applied pressure (force F) is obtained.

From an examination of the characteristics of the disclosure described and illustrated herein, the advantages that it affords are evident.

In particular, the present disclosure allows antistiction structures to be provided inside a buried cavity, maintaining a desired pressure (defined during the design step) of the cavity. In particular, the cavity has an internal pressure lower than the atmospheric pressure wherein the structure thus formed is designed to operate.

Finally, it is clear that modifications and variations may be made to the disclosure described and illustrated herein without thereby departing from the scope of the present disclosure.

For example, the layout of the buried cavity 20, 120 according to any embodiment described may be freely designed according to parameters that are not an object of the present disclosure. By way of non-limiting example, the buried cavity 20, 120 may have, in XY plane plan view, a shape chosen from quadrangular, circular, quadrangular with rounded edges, polygonal, irregular.

Furthermore, the hexagonal or honeycomb shape of the base area (in XY plane view) of the columnar structures 42*a*, 42*b* (similarly, 62*a*, 62*b*) may be different, i.e., generically polygonal or circular.

Furthermore, the shape of the columnar structures 42*a*, 42*b* (similarly, 62*a*, 62*b*) may further vary; for example they may be replaced by septa of semiconductor material, or in general by other thin structures capable of allowing the migration of silicon during the annealing step, favoring or allowing the formation of the buried cavity.

A micromechanical or microelectromechanical structure (1) may be summarized as including a semiconductor body (30); a cavity (20; 120) buried in the semiconductor body (30), internally delimited by a top wall (20*a;* 112*a*), a bottom wall (20*b;* 102*b*) which is opposite to the top wall along a direction (Z), and lateral walls (20*c*) which connect the top wall with the bottom wall; a membrane (10; 121) extending at least partially suspended on the cavity (20; 120) at the top wall (20*a;* 112*a*), the membrane may further include at least one first antistiction bump (11; 104) completely contained in the cavity (20) and which protrudes from one of the top wall (20*a;* 112*a*) and the bottom wall (20*b;* 102*b*) along said direction (Z).

The structure may further include at least one second antistiction bump (12; 114) completely contained in the cavity (20) and which protrudes from the other of the top wall (20*a;* 112*a*) and the bottom wall (20*b;* 102*b*) which accommodates the first antistiction bump (11; 104), along said direction (Z).

The first antistiction bump (11; 104) and the second antistiction bump (12; 114) may be at least partially aligned with each other along said direction (Z).

The direction (Z) may be orthogonal to at least one of the top wall (20*a;* 112*a*) and the bottom wall (20*b;* 102*b*) which delimits the cavity (20; 121).

The semiconductor body (30), the membrane (10; 121) and the first antistiction bump (11; 104) may be of monocrystalline Silicon.

The second antistiction bump (12; 114) may be of monocrystalline Silicon.

The first antistiction bump (11; 104) may have a thickness, along the direction (Z), comprised between 0.01 and 1 μm.

The second antistiction bump (12; 114) may have a thickness, along the direction (Z), comprised between 0.01 and 1 μm.

The semiconductor body (30) may include a first die (100) having a first recess (102) which accommodates the first antistiction bump (104); a second die (110) having a second recess (112), wherein the first die (100) and the second die (110) are coupled to each other by coupling regions (108) and are mutually arranged in such a way that the first and the second recesses form, together, said cavity (20) which contains the first antistiction bump (104).

The second die (110) may accommodate the second antistiction bump (114) in the second recess (112).

A method for manufacturing a micromechanical or microelectromechanical structure may be summarized as including forming, at a first surface region of the semiconductor body, first columnar portions (42*a;* 62*a*) having a first value of base area and separated from each other by first trenches (38; 58); forming, at a second surface region of the semiconductor body, contiguous to said first surface region, at least one second columnar portion (42_b_; 62_b_) having a second value of base area different from the first value of base area; epitaxially growing, above said first and second columnar portions (42_a_, 42_b_; 62_a_, 62_b_) and said first trenches (38), a membrane layer (48; 10) of semiconductor material; performing an annealing such that it causes the migration of the semiconductor material of said first and second columnar portions (42_a_, 42_b_; 62_a_, 62_b_) concurrently forming: i) a buried cavity (20) in the semiconductor body (30) below the membrane layer (48; 10), internally delimited by a top wall (20_a_; 112_a_), a bottom wall (20_b_; 102_b_) which is opposite to the top wall along a direction (Z), and lateral walls (20_c_) which connect the top wall with the bottom wall; and ii) at least one first antistiction bump (11; 104) completely contained in the cavity (20) and which protrudes from one of the top wall (20_a_; 112_a_) and the bottom wall (20_b_; 102_b_) along said direction (Z).

The method may further include forming, at the second surface region of the semiconductor body, further second columnar portions (42_b_) having the second dimension of base area, mutually separated by second trenches (38), wherein the step of epitaxially growing the membrane layer (48; 10) includes sealing said first and second trenches (38) upwardly.

The first columnar portions and the first trenches define, at the first surface region, a first full/empty ratio of said semiconductor material, and wherein the second columnar portions and the second trenches define, at the second surface region, a second full/empty ratio of said semiconductor material, the value of the first full/empty ratio being lower than the value of the second full/empty ratio.

The second value of base area may be greater than the first value of base area.

Along a cross-section of said semiconductor body (30), the first trenches (38) may have a greater dimension than the second trenches (38) and the second columnar portions (42_b_) have a greater dimension than the first columnar portions (42_a_).

Along a cross-section of said semiconductor body (30), said at least one second columnar portion (42_b_; 62_b_) may have a greater dimension than each of the first columnar portions (42_a_; 62_a_).

Said first columnar portions (42_a_; 62_a_) and said at least one second columnar portion (42_b_; 62_b_) may have a polygonal section on a plane orthogonal to said direction (Z).

Performing the annealing may further form concurrently at least one second antistiction bump (12; 114) completely contained in the cavity (20) and which protrudes along said direction (Z) from the other of the top wall (20_a_; 112_a_) and the bottom wall (20_b_; 102_b_) which accommodates the first antistiction bump (11; 104).

The semiconductor body (30), the membrane layer and the first antistiction bump (11; 104) may be of monocrystalline Silicon.

The second antistiction bump (12; 114) may be of monocrystalline Silicon.

The first antistiction bump (11; 104) may have a thickness, along the direction (Z), comprised between 0.01 and 1 μm.

The second antistiction bump (12; 114) may have a thickness, along the direction (Z), comprised between 0.01 and 1 μm.

Said step of performing an annealing may be performed in a deoxidizing environment.

A method for manufacturing a micromechanical or microelectromechanical structure may be summarized as including forming, in a first die (100), a first recess (102); forming, in the first recess (102), a first antistiction bump (104); forming, in a second die (110), a second recess (112); and coupling the first die (100) to the second die (110) by coupling regions (108) and in such a way that the first and the second recesses form, together, a cavity (20) which contains the first antistiction bump (104).

The method may further include the step of forming, in the second recess (112), a second antistiction bump (114), the step of coupling being performed in such a way that said cavity (20) further contains the second antistiction bump (114).

A microelectromechanical transducer, may be summarized as including a micromechanical or microelectromechanical structure.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing a structure, the method comprising:

forming, at a first surface region of the semiconductor body, first columnar portions having a first value of base area and separated from each other by first trenches;

forming, at a second surface region of the semiconductor body, contiguous to said first surface region, at least one second columnar portion having a second value of base area different from the first value of base area;

epitaxially growing, above said first and second columnar portions and said first trenches, a membrane layer of semiconductor material; and annealing that causes the migration of the semiconductor material of said first and second columnar portions concurrently forming:

a buried cavity in the semiconductor body below the membrane layer, internally delimited by a first wall, a second wall opposite to the first wall, and third and fourth walls coupled between the first wall with the second wall; and at least one first antistiction bump, completely contained in the cavity, protruding from one of the first wall and the second wall.

2. The method according to claim 1, comprising forming, at the second surface region of the semiconductor body, further second columnar portions having the second value of base area, mutually separated by second trenches, wherein epitaxially growing the membrane layer includes sealing said first and second trenches towards the respective first and second surface region of the semiconductor body.

3. The method according to claim 2, wherein the first columnar portions and the first trenches define, at the first surface region, a first full/empty ratio of said semiconductor material, and wherein the second columnar portions and the second trenches define, at the second surface region, a second full/empty ratio of said semiconductor material, the value of the first full/empty ratio being lower than the value of the second full/empty ratio.

4. The method according to claim 2, wherein the second value of base area is greater than the first value of base area.

5. The method according to claim 2, wherein, along a cross-section of said semiconductor body, the first trenches have a greater dimension than the second trenches and the second columnar portions have a greater dimension than the first columnar portions.

6. The method according to claim 1, wherein, along a cross-section of said semiconductor body, said at least one second columnar portion has a greater dimension than each of the first columnar portions.

7. The method according to claim 1, wherein said first columnar portions and said at least one second columnar portion have a polygonal shape.

8. The method according to claim 1, wherein the annealing forms concurrently at least one second antistiction bump, completely contained in the cavity, protruding from the other of the first wall and the second wall which accommodates the first antistiction bump.

9. The method according to claim 8, wherein the semiconductor body, the membrane layer, the first antistiction bump, and the at least one second antistiction bump are of monocrystalline Silicon.

10. The method according to claim 9, wherein the first and second antistiction bumps have a thickness between 0.01 and 1 μm.

11. The method according to claim 1, wherein annealing is performed in a deoxidizing environment.

12. A method for manufacturing a structure, the method comprising:

forming, in a substrate, a first plurality of columns surrounded by a respective first plurality of trenches, each first column having a first base area;

forming, in the substrate, a second plurality of columns surrounded by a respective second plurality of trenches, each second column having a second base area different from the first base area;

forming a first layer on each first and second column, the first layer covering an opening of each first and second trench; and forming, in the first substrate, a cavity having a first wall on the first layer, the first wall including a first antistiction bump.

13. The method according to claim 12, comprising forming a second antistiction bump on a second wall in the cavity, the second wall being opposite the first wall.

14. A method, comprising:

forming, in a first surface of a semiconductor substrate, a plurality of first columns surrounded by a plurality of first trenches, each first column having a first base area;

forming, in the first surface, a plurality of second columns surrounded by a plurality of second trenches, each second column having a second base area greater than the first base area;

forming a first membrane layer on the first surface and each of the first and second columns; and forming a cavity in the semiconductor substrate, the forming the cavity including:

a first wall on the first membrane layer, the first wall including a first antistiction bump; and a second wall opposite the first wall, the second wall including a second antistiction bump.

15. The method according to claim 14, wherein each first and second trench is hexagonal.

16. The method according to claim 14, wherein the forming the first membrane layer includes performing an epitaxial growth to entirely enclose each first and second trench.

17. The method according to claim 14, wherein the forming the cavity includes annealing the semiconductor substrate, the first plurality of trenches, and the second plurality of trenches.

18. The method according to claim 17, wherein, during the annealing the semiconductor substrate, silicon atoms in the first and second pluralities of trenches migrate to form the cavity.

19. The method according to claim 18, wherein the first wall is opposite the second wall along a first direction and the first and second antistiction bumps are aligned along the first direction.

20. The method according to claim 19, wherein the first and second antistiction bumps are formed from the second plurality of trenches during the annealing.

* * * * *